United States Patent
Deng et al.

(10) Patent No.: US 6,922,370 B2
(45) Date of Patent: Jul. 26, 2005

(54) HIGH PERFORMANCE SRAM DEVICE AND METHOD OF POWERING-DOWN THE SAME

(75) Inventors: Xiaowei Deng, Plano, TX (US); Hugh Mair, Fairview, TX (US); Theodore W. Houston, Richardson, TX (US); Luan Dang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 10/733,485

(22) Filed: Dec. 11, 2003

(65) Prior Publication Data

US 2005/0128852 A1 Jun. 16, 2005

(51) Int. Cl.[7] .................................................. G11C 7/00
(52) U.S. Cl. ........................ 365/226; 365/227; 365/229
(58) Field of Search ................................ 365/226, 227, 365/229

(56) References Cited

U.S. PATENT DOCUMENTS

| | | | | |
|---|---|---|---|---|
| 5,563,839 A | * | 10/1996 | Herdt et al. ................. | 365/227 |
| 5,969,995 A | * | 10/1999 | Morishima ............. | 365/189.01 |
| 6,307,803 B1 | * | 10/2001 | Chien ......................... | 365/227 |
| 6,839,299 B1 | * | 1/2005 | Bhavnagarwala et al. .. | 365/226 |

* cited by examiner

Primary Examiner—Ahn Phung
(74) Attorney, Agent, or Firm—Rose Alyssa Keagy; W. James Brady, III; Frederick J. Telecky, Jr.

(57) ABSTRACT

An SRAM device and a method of powering-down an SRAM device. In one embodiment, the SRAM device includes (1) an SRAM array coupled to an SRAM array low voltage source that provides a low SRAM array supply voltage $V_{SB}$ to the SRAM device and (2) main column peripheral circuitry having main pre-charge circuitry free of an SRAM header, coupled to the SRAM array by bit lines and coupled to a sleep mode controller through an associated main column peripheral driving circuitry that is configured to isolate the bit lines from a power supply during a sleep mode.

23 Claims, 2 Drawing Sheets

HIGH PERFORMANCE SRAM DEVICE AND METHOD OF POWERING-DOWN THE SAME

TECHNICAL FIELD OF THE INVENTION

The present invention is directed, in general, to memory devices and, more specifically, to a Static Random-Access Memory (SRAM) device and a method of powering-down the same.

BACKGROUND OF THE INVENTION

Different types of memory are used in electronic apparatus for various purposes. Read-Only Memory (ROM) and Random Access Memory (RAM) are two such types of memory commonly used within computers for different memory functions. ROM retains its stored data when power is switched off and therefore is often employed to store programs that are needed for initializing (colloquially, "booting up") an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refreshing thereby making it a faster memory option. In addition, SRAM may use metal-oxide-semiconductor (MOS) technology, allowing it to have a relatively low standby power. These attributes make SRAM devices particularly desirable for portable equipment, such as laptop computers and personal digital assistants.

A typical SRAM device includes a matrix of addressable memory cells arranged in columns and rows and referred to as an SRAM array. A typical memory cell includes two access transistors and a flip-flop having two memory transistors and two loads. The gates of the access transistors in each row are connected to a word line and the sources of each access transistor are connected to either one of a bit line pair, B or $\overline{B}$. Peripheral circuitry associated with the rows (or word lines) and peripheral circuitry associated with the columns (or bit lines) facilitate reading data from, and writing data to, the memory cells.

Column periphery circuitry includes main column peripheral driving circuitry and main column peripheral circuitry. Typically, the main column peripheral driving circuitry drives an associated main column peripheral circuitry. For example, main pre-charge driving circuitry is configured to drive main pre-charge circuitry for the SRAM array. Additionally, the SRAM device includes a controller having column periphery control drivers. The column periphery control drivers are typically configured to drive the main column peripheral driving circuitry such as the main pre-charge driving circuitry.

Generally, to read data from a memory cell, a word line driver may activate a word line according to an address decoded by a row decoder and received via a row signal path that typically includes an address bus connected to the SRAM device. The access transistors turn on and connect the outputs of the flip-flop to the bit line pair sending signals representing the data in the memory cell to a sense amplifier coupled to the bit line pair that amplifies the potential difference thereon. After the data is stabilized, a column decoder selects the corresponding column, or bit line pair, and outputs a data signal to a data output buffer and then to the external circuitry of the associated electronic apparatus. Essentially, data may be written to each memory cell in an opposite way.

As mentioned above, to retain the data written to the matrix of memory cells, or memory array, each memory cell must have a continuous supply of power. SRAM devices, however, are often employed within battery-powered wireless apparatus where power consumption is an important design parameter. Accordingly, wireless apparatus may be transitioned from an active or idle mode to a standby mode of lower power consumption. As transistor size continues to diminish (e.g., 90 nm transistors), current leakage may be unacceptably high even during standby mode, requiring a transition to a still lower power consumption level, a data retention or sleep mode, to conserve power adequately. The battery-powered wireless apparatus, therefore, may power-down the row and column circuitry associated with the memory array and enter the sleep mode while still supplying sufficient power to the memory array to retain data.

Presently, various powering-down designs for the peripheral circuitry are used. Typically, each of the various designs seek a balance among complexity, reliability and minimum power consumption during the sleep mode. To achieve absolute minimum power during the sleep mode, all of the peripheral circuitry may be powered-down while sufficient power to the memory array is maintained. Additionally, powering-down designs may also strive to reduce voltage fluctuations, or "wiggling," in word lines caused by the peripheral circuitry while transitioning from standby to sleep mode to prevent false reads or writes on the word line. Once the sleep mode has been entered, additional problems may be encountered. For example, currents may leak from the memory array to the peripheral circuitry associated with the columns.

In some existing SRAM devices, powering-down to the sleep mode may be completed by employing a single switch pair to control power for the SRAM device. One design to minimize memory array leakage during sleep mode calls for keeping the bit lines floating (at a floating voltage typically near the word line voltage) or clamped at a raised low array voltage supply, $V_{SB}$, level while the word lines are maintained at either the low power supply, $V_{SS}$, level or the $V_{SB}$ level or there between. In some SRAM devices, SRAM headers or footers (those local to the SRAM) may be coupled in series with main column peripheral circuitry to float the bit lines. Alternatively, the main column peripheral circuitry may be isolated from the bit lines by inserting isolation transistors in series with main pre-charge circuitry, main write circuitry, main column multiplexers, and main sense amplifiers for each bit line. Undesirably, a significant amount of gate and subthreshold current leakage among some of the large column periphery transistors whose gate, drain, and source are at different potentials (e.g., 0.8 volts versus 0.0 volts) may still occur, and the added transistors in series with the main column periphery circuitry result in lower performance for the column periphery circuitry and the SRAM device.

Accordingly, what is needed in the art is an improved high performance low-power SRAM device that maintains high performance during active mode while minimizes current leakage during sleep mode and an improved method of powering-down an SRAM device to the sleep mode. More specifically, what is needed in the art is an improved SRAM device that isolates bit lines without negatively impacting the performance of the SRAM's column periphery circuitry.

SUMMARY OF THE INVENTION

To address the above-discussed deficiencies of the prior art, the present invention provides an SRAM device and a method of powering-down an SRAM device. In one embodiment, the SRAM device includes (1) an SRAM array coupled to an SRAM array low voltage source that provides a low SRAM array supply voltage $V_{SB}$ to the SRAM device and (2) main column peripheral circuitry having main pre-charge circuitry free of an SRAM header, coupled to the SRAM array by bit lines and coupled to a sleep mode controller through an associated main column peripheral driving circuitry that is configured to isolate the bit lines from a power supply during a sleep mode.

Unlike prior art SRAM devices, the present invention does not employ devices in the speed critical path of the column periphery circuitry to isolate the bit lines for sleep mode. Instead, the present invention introduces the novel concept of employing a sleep mode controller to turn off the main column peripheral driving circuitry associated with the main column peripheral circuitry to isolate the bit lines during the sleep mode. Thus, the present invention does not negatively impact the performance of the column periphery circuitry as compared to prior art devices.

The sleep mode controller may employ a header. For purpose of the present invention, a header is a transistor positioned between a high voltage supply of the SRAM device, $V_{DD}$, and selected circuitry. More specifically, an SRAM header is limited to circuitry of the SRAM device. Thus, for example, an SRAM header does not include a chip level header or a partial chip level header. Similarly, a footer is a transistor positioned between a low voltage supply of the SRAM device, $V_{SS}$, and the selected circuitry.

In another aspect, the present invention provides the method of powering-down an SRAM device having main column peripheral circuitry coupled to an SRAM array by bit lines including (1) transmitting a power down signal to an SRAM array low voltage source coupled to the SRAM array that raises a low SRAM array supply voltage $V_{SB}$ to an SRAM array reference voltage $V_{BB}$ and (2) providing the SRAM array reference voltage $V_{BB}$ to a sleep mode controller, coupled to the main column peripheral circuitry by a main column peripheral driving circuitry, to isolate the bit lines from a power supply.

By controlling the main column peripheral driving circuitry, main pre-charge circuitry, main column MUX, main write circuitry, or main sense amp may be turned off during sleep mode to isolate bit lines and reduce current leakage from the SRAM array to the main column peripheral circuitry. Thus, transistors are not required in series between the SRAM array and the main column peripheral circuitry. Accordingly, the present invention may advantageously reduce a total size of the SRAM device and reduce performance degradation of the main column peripheral circuitry. For example, simulations have indicated an added pre-charge time of about 37 ps with a conventional SRAM having isolating transistors compared to about 3 ps for the novel SRAM device of the present invention.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
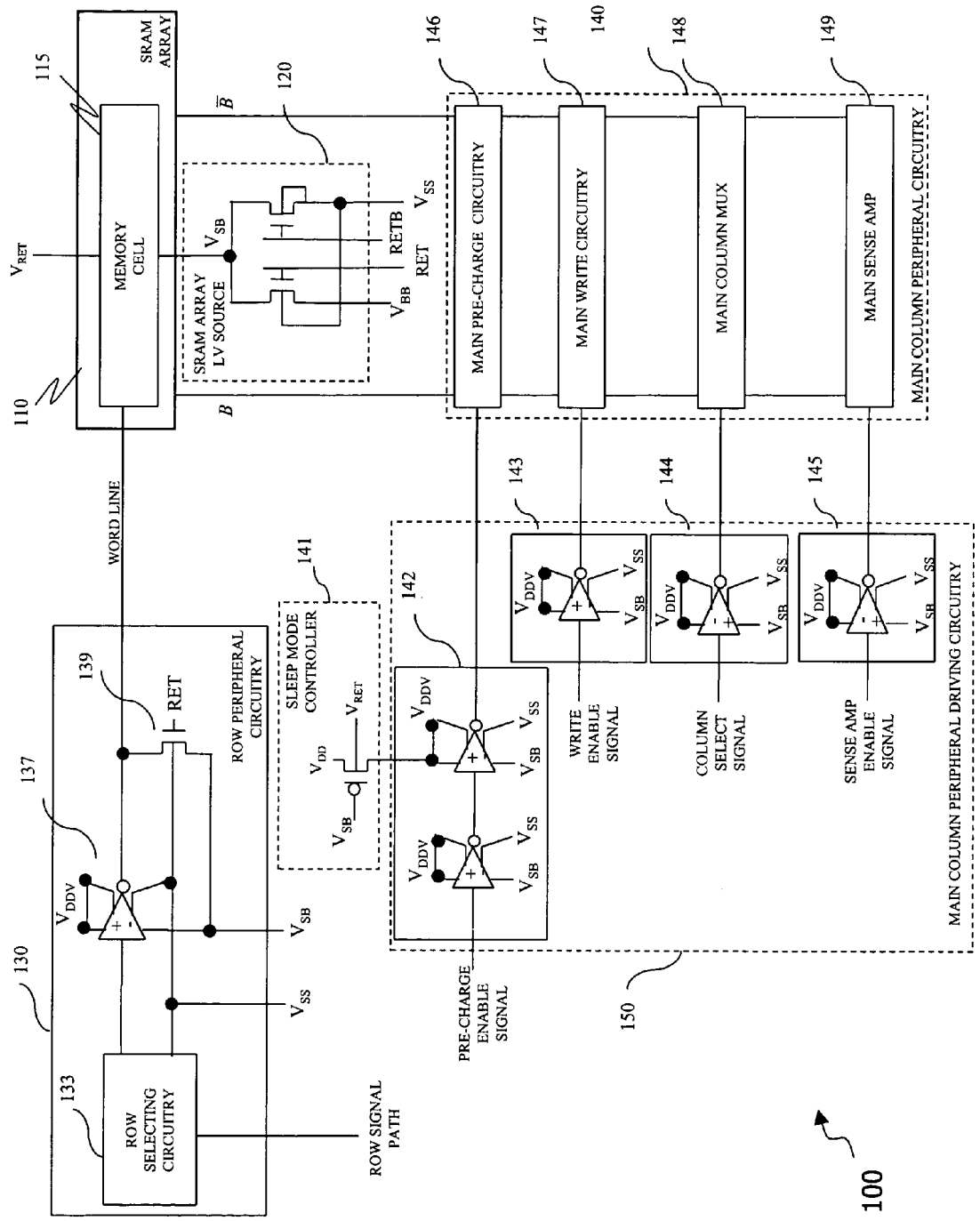
FIG. 1 illustrates a circuit diagram of an embodiment of an SRAM device constructed according to the principles of the present invention.

Referring initially to FIG. 1, illustrated is a circuit diagram of an embodiment of an SRAM device 100 constructed according to the principles of the present invention. The SRAM device 100 includes an SRAM array 110, an SRAM array low voltage source 120, row peripheral circuitry 130, main column peripheral circuitry 140, a sleep mode controller 141 and main column peripheral driving circuitry 150. Typically, the SRAM array 110 includes multiple memory cells organized in a matrix of columns and rows and correspondingly multiple word lines and bit lines. For ease of discussion, however, only a single memory cell 115 of the SRAM array 110 is illustrated. Accordingly, a single word line and bit line pair are illustrated and discussed along with the associated row and main column peripheral circuitry 130, 140.

The row peripheral circuitry 130 includes row selecting circuitry 133, a word line driver 137 and a word line keeper 139. The main column peripheral driving circuitry 150 includes main pre-charge driving circuitry 142, main write driving circuitry 143, main column MUX driving circuitry 144 and main sense amp driving circuitry 145. The main column peripheral circuitry 140 includes main pre-charge circuitry 146, main write circuitry 147, main column MUX 148 and a main sense amplifier 149. The main pre-charge circuitry 146 is free of an SRAM header. Thus, the main pre-charge circuitry 146 is not directly coupled to an SRAM header. In some embodiments, the main sense amp 149 is also free of an SRAM header. The main column peripheral circuitry 140 and the main column peripheral driving circuitry 150 are collectively referred to as column periphery circuitry.

The SRAM device 100 may be a memory component for an associated microprocessor, digital signal processor (DSP), application-specific integrated circuit (ASIC) or larger electronic apparatus. In some embodiments, more than one SRAM device 100 may comprise the memory component. The high voltage supply $V_{DD}$ for the SRAM device 100 may be controlled by a chip-level header that reduces the high voltage supply $V_{DD}$ from an active mode value of about 1.3 volts to about 0.0 volts during sleep mode.

Typically, signal paths and a data interface of the associated apparatus may be coupled to the SRAM device 100 to send address information and retrieve/send data for reading/writing the data from/to specific memory cells of the SRAM array 110. One skilled in the art will understand coupling of the SRAM device 100 to the associated apparatus.

The memory cell 115 of the SRAM array 110 has a unique address for writing and reading the data. The memory cell 115 may employ MOSFETs and a flip-flop to store the data as a one (high) or a zero (low). In the illustrated embodiment, the SRAM array 110 may have 256 columns and 256 rows of memory cells. One skilled in the pertinent art, however, will understand that the size of the SRAM array 110 may vary in different implementations.

The SRAM array low voltage source 120 may be a voltage regulator. More specifically, the SRAM array low voltage source 120 may be a sinking low drop-out voltage regulator. The SRAM array low voltage source 120 may be coupled to the low voltage supply $V_{SS}$ and, typically, may provide a low SRAM array supply voltage, $V_{SB}$, to the SRAM array 110. The low voltage supply $V_{SS}$ and the low SRAM array supply voltage $V_{SB}$ may have a value of about 0.0 volts. When in the sleep mode, the SRAM array low voltage source 120 may raise the low SRAM array supply voltage $V_{SB}$ from a low supply voltage $V_{SS}$ to an array reference voltage $V_{BB}$. The array reference voltage $V_{BB}$ may have a value of about 0.8 volts. A power-down signal and its inverse (represented by RET and RETB in FIG. 1 to signify retain data) may control operation of the SRAM array low voltage source 120 to raise the low SRAM array supply voltage $V_{SB}$ when entering and during the sleep mode. One skilled in the art will understand that other ways may also be used to form the SRAM array low voltage source 120. A retain power supply $V_{RET}$ may provide a high voltage for the SRAM array 110 during stand-by and sleep mode. The $V_{RET}$ may have a value of about 1.3 volts.

The reading and writing of the data from/to the SRAM array 110 may be controlled by the row peripheral circuitry 130 and the main column peripheral circuitry 140. The row peripheral circuitry 130 may control activating a word line associated with one of the rows of the SRAM array 110. The word line driver 137 may activate the word line for reading or writing based on an address signal received via a row signal path and decoded by the row selecting circuitry 133. For the six-terminal inverter symbol shown in the word line driver 137 (and other places in FIG. 1) the top left terminal represents the PMOS source, the top right terminal represents the PMOS body, the bottom left terminal represents the NMOS source, and the bottom right terminal represents the NMOS body. The row selecting circuitry 133 may include components typically included in a row pre-decoder and a row decoder of a conventional SRAM device. One skilled in the art will understand the configuration and operation of the row selecting circuitry 133 and the activation of a word line for reading or writing.

The word line keeper 139 may be a transistor that is turned on to ensure the word line is biased low when entering and during the sleep mode. Thus, the word line keeper 139 may deter the row peripheral circuitry 130 from turning on the word line and assist the SRAM array 110 in maintaining the stored data while operating in the sleep mode. As illustrated, the word line keeper 139 may be an nMOSFET controlled by the power-down signal (RET).

The main column peripheral circuitry 140 controls selecting the columns of the SRAM array 110 for reading and writing. The main column peripheral circuitry 140 may include column address decoders for determining memory column locations within the SRAM array 110 and control circuitry for determining between writing or reading the data. The main pre-charge circuitry 146, the main write circuitry 147, the main column MUX 148 and the main sense amplifier 149 may facilitate reading and writing data from/to the correct column address that has been decoded. The main pre-charge driving circuitry 142, the main write driving circuitry 143, the main column MUX driving circuitry 144 and the main sense amp driving circuitry 145, for example, may receive control signals along signal paths to indicate what data to write and which memory location to write the data. As with the row peripheral circuitry 130, the main column peripheral circuitry 140 may also include additional components that are not illustrated or discussed herein to facilitate writing and reading the data.

A typical main pre-charge circuitry 146 is a three-transistor circuit consisting of two pre-charge PMOS transistors and one equalization PMOS transistor. The sources of the pre-charge transistors are connected to $V_{DD}$, the drains of the pre-charge transistors are connected to respective bit lines, the source and drain of the equalization transistor are also connected to the respective bit lines, and the gates of all the three transistors are tied together as the control input. Typically, during sleep (data retention) mode, $V_{DD}$ for the SRAM device 100 is shut down by a chip level header and drops to about 0.0 volts while the input to the main pre-charge circuitry 146 is clamped at $V_{SB}$ at about, for example, 0.8 volts. Hence during sleep mode, all the three PMOS transistors are turned off when the bit lines float to near $V_{SB}$, since the gate voltage of the PMOS transistor is not a threshold voltage below the source or drain voltage. Thus, control of the voltage supplies to the pre-charge peripheral driving circuit ensures that the pre-charge transistors will be turned off in sleep mode allowing the bit lines to float without requiring headers in the pre-charge circuit that would have had a negative impact on performance and area. One skilled in the art will understand the typical configurations of other components of the main column peripheral circuitry 140, and that the other components can be similarly turned off during the sleep mode.

Unlike some conventional SRAM devices, the SRAM device 100 does not have isolating transistors in series between the SRAM array 110 and the main column peripheral circuitry 140 to allow the bit lines to float during sleep mode. Instead, the SRAM device 100 employs the sleep mode controller 141 to control at least a portion of the main column peripheral driving circuitry 150 such that the at least a portion of the main column peripheral circuitry 140 are turned off during sleep mode. In some embodiments, a single driving circuitry of the main column peripheral driving circuitry 150 may be connected to and controlled by the sleep mode controller 141. Thus, a single circuitry of the main column peripheral circuitry 140 may be turned off to provide isolation. In other embodiments, the sleep mode controller 141 may be coupled to and control more than one circuitry of the main column peripheral driving circuitry 150. For example, the sleep mode controller 141 may be coupled to the main pre-charge driving circuitry 142, the main write driving circuitry 143, the main column MUX driving circuitry 144 and the main sense amp driving circuitry 145, such that, the main pre-charge circuitry 146, the main write circuitry 147, the main column MUX 148 and the main sense amp 149 are each turned off during sleep mode. Of course, one skilled in the art will understand that the sleep mode controller 141 may be coupled to any combination of each circuitry of the main column peripheral driving circuitry 150. Additionally, the sleep mode controller 141 may be coupled to each circuitry of the main column peripheral driving circuitry 150 and selectively turn off one or a combination of the circuitry instead of each coupled circuitry. Since isolating transistors are not employed, the SRAM device 100 may provide a decrease in pre-charge time, sense margin and bit line discharge time during read and write operations. Additionally, the SRAM device 100 may provide a decrease in peripheral area required for operating.

As illustrated in FIG. 1, the sleep mode controller 141 may be a header and, more specifically, a pMOSFET. Of course, in other embodiments, the sleep mode controller 141 may include or be other components configured to control the main column peripheral driving circuitry 150 associated with the main column peripheral circuitry 140 during and entering the sleep mode. The sleep mode controller 141 may be controlled by an output of the SRAM array low voltage source 120 applied to a gate of the sleep mode controller 141. Typically, the output of the SRAM array low voltage source 120 may be the low SRAM array supply voltage $V_{SB}$. Before entering sleep mode, therefore, the sleep mode controller 141 is turned on by the low SRAM array supply voltage $V_{SB}$ and provides a virtual high supply voltage, $V_{DDV}$, to the main column peripheral driving circuitry 150 at a voltage of about 1.3 volts. Entering and during the sleep mode, the power-down signal (RET) goes high (e.g. from 0.0 volts to 1.3 volts) raising the low SRAM array supply voltage $V_{SB}$ to the array reference voltage $V_{BB}$ at the SRAM array low voltage source 120 thereby turning off the sleep mode controller 141. Thus, during sleep mode, the sleep mode controller 141 provides the virtual high supply voltage $V_{DDV}$ to the main column peripheral driving circuitry 150 at a voltage of about the array reference voltage $V_{BB}$.

Also, as illustrated in FIG. 1, the sleep mode controller 141 may also serve as a row header that is employed to control the word line driver 137. Of course in other embodiments, the sleep mode controller 141 and the row header may be separate transistors. Employing a single transistor as the sleep mode controller 141 and the row header, however, may advantageously maintain the size of the word line keeper 139 and the row header and reduce a voltage dip on the virtual high supply voltage $V_{DDV}$ during an active mode by increasing capacitance. The increased capacitance on the virtual high supply voltage $V_{DDV}$ may result from the word line driver 137 and the main column peripheral circuitry 140 not simultaneously switching/sinking current from a node of the virtual high supply voltage $V_{DDV}$ node.

The main pre-charge driving circuitry 142, the main write driving circuitry 143, the main column MUX driving circuitry 144 and the main sense amp driving circuitry 145 may be employed to drive the main pre-charge circuitry 146, the main write circuitry 147, the main column MUX 148 and the main sense amp 149, respectively. Each circuitry (142, 143, 144, 145) of the main column peripheral driving circuitry 150 may include components typically included in conventional main column peripheral driving circuitry employed in a conventional SRAM device. As illustrated, each of the main column peripheral driving circuitry 150 may be commonly coupled to the sleep mode controller 141. As mentioned above, however, a single circuitry of the main column peripheral driving circuitry 150 may be coupled to the sleep mode controller 141. As illustrated, a PMOS source of each of the main column peripheral driving circuitry 150 may be commonly coupled to the sleep mode controller 141. Additionally, an NMOS source of each of the main column peripheral driving circuitry 150 may be commonly coupled to the SRAM array low voltage source 120 to receive the low array supply voltage $V_{SB}$. During sleep mode, the sleep mode controller 141 may clamp at least one of the main column peripheral driving circuitry 150 at the virtual high supply voltage $V_{DDV}$ which may be at the array reference voltage $V_{BB}$. In some embodiments, the sleep mode controller 141 may clamp each of the main column peripheral driving circuitry 150.

Therefore, during sleep mode, the virtual high supply voltage $V_{DDV}$ node created by the sleep mode controller 141 may be held at about the array reference voltage $V_{BB}$ through the word line keeper 139 and PMOS transistors of the word line driver 137. Since the inputs of the main column peripheral driving circuitry 150 are about 0.0 volts during the sleep mode, the output of the main column peripheral driving circuitry 150 are clamped at about the array reference voltage $V_{BB}$ by the driving circuitry's PMOS transistors, turning off the main pre-charge circuitry 146, the main write circuitry 147, the main column MUX 148 and the main sense amp 149.

Figure 2:
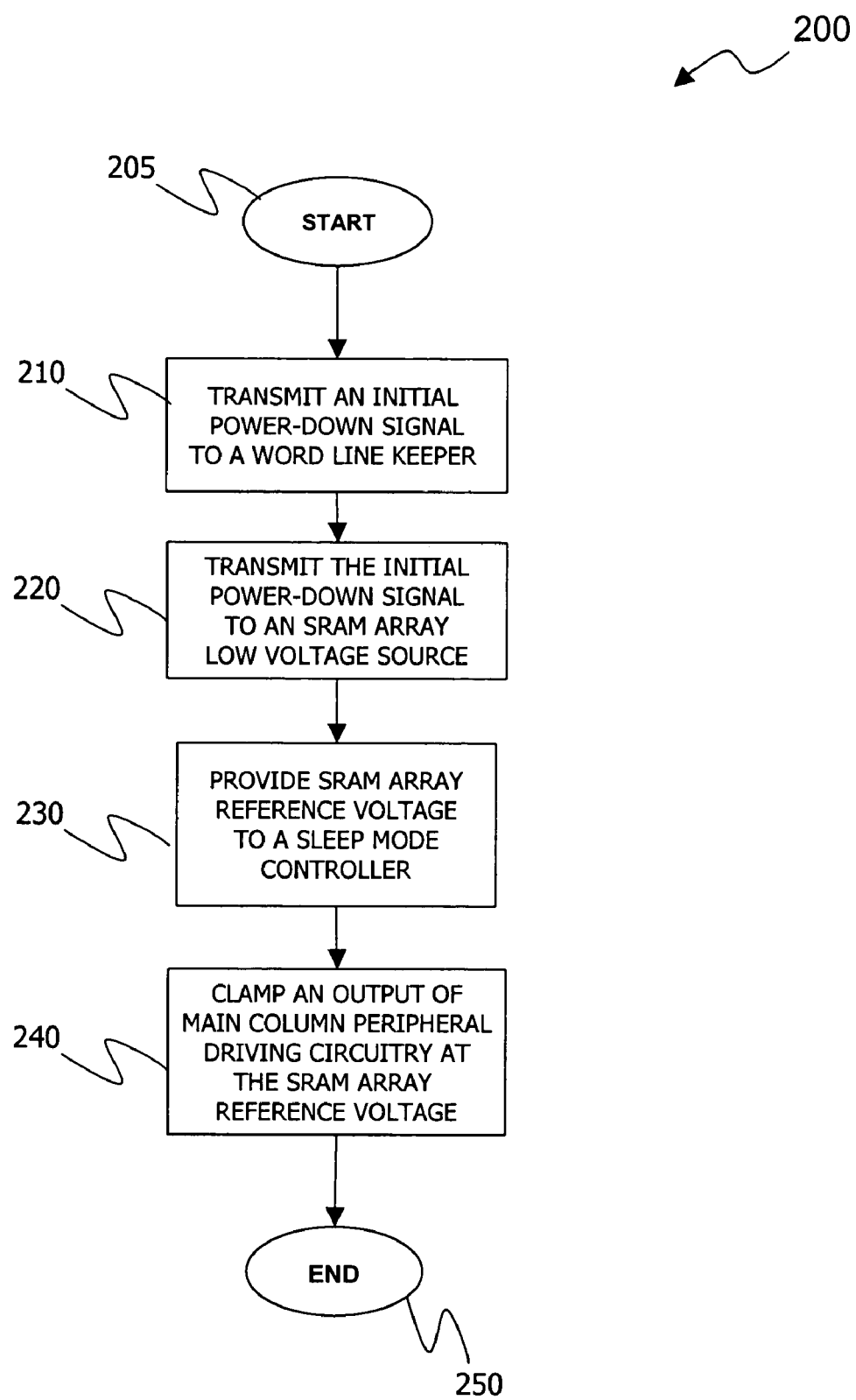
FIG. 2 illustrates a flow diagram of an embodiment of a method of powering-down an SRAM device carried out according to the principles of the present invention.

Turning now to FIG. 2, illustrated is an embodiment of a method of powering-down an SRAM, generally designated 200, carried out according to the principals of the present invention. The SRAM device includes main column peripheral circuitry coupled to an SRAM array by bit lines. The method begins in a step 205, wherein it is desired to enter a sleep mode.

After beginning, an initial power-down signal may be transmitted to a word line keeper associated with row peripheral circuitry of an SRAM array in a step 210. The initial power-down signal may turn on the word line keeper to bias low or hold low an associated word line coupled to the word line driver. The word line keeper may be an nMOSFET.

After transmitting the initial power-down signal to the word line keeper, the initial power-down signal is transmitted to an SRAM array low voltage source coupled to the SRAM array in a step 220. The power-down signal may turn on a MOSFET of the SRAM array low voltage source to raise a low SRAM array supply voltage $V_{SB}$ from a low supply voltage $V_{SS}$ to an SRAM array reference voltage $V_{BB}$. The SRAM array reference voltage $V_{BB}$ may be about 0.8 volts whereas the low supply voltage $V_{SS}$ may be about 0.0 volts. The SRAM array low voltage source may be a sinking low drop out voltage regulator.

After transmitting the initial power-down signal to the SRAM array low voltage source, the SRAM array reference voltage is provided to a sleep mode controller to isolate the bit lines from a power supply in a step 230. The bit lines may be isolated from a high power supply or a low power supply. The sleep mode controller may be a pMOSFET. In some embodiments, the sleep mode controller may be a row header associated with the row peripheral circuitry.

The sleep mode controller may isolate the bit lines by turning off main column peripheral driving circuitry associated with the main column peripheral circuitry. The main column peripheral driving circuitry may include a main pre-charge driving circuitry, a main write driving circuitry, a main column MUX driving circuitry or a main sense amp driving circuitry. The sleep mode controller, however, may be coupled to or control less than each circuitry of the main column peripheral driving circuitry. For example, the sleep mode controller may be coupled to a single circuitry, such as the main column MUX driving circuitry, of the main column peripheral driving circuitry. Additionally, all of the main column peripheral circuitry may not be turned off to isolate the bit lines. For example, the main sense amp may be used to isolate the bit lines in one embodiment while the main column MUX may be used to isolate the bit lines in another embodiment. The SRAM array reference voltage may be applied to a gate of the sleep mode controller to turn off the sleep mode controller and provide a virtual high supply voltage $V_{DDV}$ that is employed to turn off a circuitry of the main column peripheral driving circuitry.

After providing the SRAM array reference voltage to the sleep mode controller, an output of the main column peripheral driving circuitry is clamped at the SRAM array reference voltage $V_{BB}$ in a step 240. The output of the main column peripheral driving circuitry may be clamped at the SRAM array reference voltage $V_{BB}$ by coupling a PMOS source of the main column peripheral driving circuitry to the sleep mode controller and coupling an NMOS source of the main column peripheral driving circuitry to the SRAM array low voltage source. During sleep mode, the output of the SRAM array low voltage source and the virtual high supply voltage $V_{DDV}$ provided by the sleep mode controller may be the SRAM array reference voltage $V_{BB}$. Thus, with inputs of about 0.0 volts, the main column peripheral driving circuitry may be clamped at the SRAM array reference voltage $V_{BB}$. The value of the SRAM array reference voltage $V_{BB}$ may be at about 0.8 volts. After clamping the outputs of the main column peripheral driving circuitry, the method of powering-down the SRAM device ends in a step 250.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. An SRAM device, comprising:
    an SRAM array coupled to an SRAM array low voltage source that provides a low SRAM array supply voltage $V_{SB}$ to said SRAM device; and
    main column peripheral circuitry having main pre-charge circuitry free of an SRAM header, coupled to said SRAM array by bit lines and coupled to a sleep mode controller through an associated main column peripheral driving circuitry that is configured to isolate said bit lines from a power supply during a sleep mode.

2. The SRAM device as recited in claim 1 wherein said main column peripheral circuitry further includes a main column MUX, main write circuitry and a main sense amp.

3. The SRAM device as recited in claim 2 wherein said sleep mode controller is configured to isolate said bit lines by employing said main column peripheral driving circuitry to turn off circuitry selected from the group consisting of:
    said main pre-charge circuitry,
    said main column MUX,
    said main write circuitry, and
    said main sense amp.

4. The SRAM device as recited in claim 1 wherein said main column peripheral driving circuitry includes circuitry selected from the group consisting of:
    main pre-charge driving circuitry,
    main write driving circuitry,
    main column MUX driving circuitry, and
    main sense amp driving circuitry.

5. The SRAM device as recited in claim 1 wherein an output of said main column peripheral driving circuitry is clamped at an array reference voltage $V_{BB}$ during said sleep mode.

6. The SRAM device as recited in claim 1 wherein said main column peripheral circuitry further includes a main sense amp free of an SRAM header.

7. The SRAM device as recited in claim 1 wherein said SRAM array low voltage source is a sinking low drop-out voltage regulator.

8. The SRAM device as recited in claim 1 wherein said sleep mode controller is a pMOSFET.

9. The SRAM device as recited in claim 1 wherein said SRAM array low voltage source raises said low SRAM array supply voltage $V_{SB}$ to an array reference voltage $V_{BB}$ during sleep mode.

10. The SRAM device as recited in claim 1 wherein said sleep mode controller is configured to isolate said bit lines from a high power supply.

11. The SRAM device as recited in claim 1 wherein an output voltage of said main pre-charge driving circuitry is raised during sleep mode to turn off said main pre-charge circuitry.

12. The SRAM device as recited in claim 11 wherein said output voltage is raised to about said low SRAM array supply voltage $V_{SB}$.

13. The SRAM device as recited in claim 1 wherein said sleep mode controller includes a row header.

14. A method of powering-down an SRAM device having main column peripheral circuitry coupled to an SRAM array by bit lines, comprising:
    transmitting a power down signal to an SRAM array low voltage source coupled to said SRAM array that raises a low SRAM array supply voltage $V_{SB}$ to an SRAM array reference voltage $V_{BB}$; and
    providing said SRAM array reference voltage $V_{BB}$ to a sleep mode controller, coupled to said main column peripheral circuitry by a main column peripheral driving circuitry, to isolate said bit lines from a power supply.

15. The method as recited in claim 14 wherein said main column peripheral circuitry includes main pre-charge circuitry, a main column MUX, main write circuitry and a main sense amp.

16. The method as recited in claim 15 wherein said sleep mode controller isolates said bit lines by employing said main column peripheral driving circuitry to turn off circuitry selected from the group consisting of:
    said main pre-charge circuitry,
    said main column MUX,
    said main write circuitry, and
    said main sense amp.

17. The method as recited in claim 14 wherein said main column peripheral driving circuitry includes circuitry selected from the group consisting of:
    main pre-charge driving circuitry,
    main write driving circuitry,
    main column MUX driving circuitry, and
    main sense amp driving circuitry.

18. The method as recited in claim 14 further comprising clamping an output of said main column peripheral driving circuitry at an array reference voltage $V_{BB}$.

19. The method as recited in claim 14 wherein said main column peripheral circuitry includes main pre-charge circuitry free of an SRAM header.

20. The method as recited in claim 14 wherein said main column peripheral circuitry includes a main sense amp free of an SRAM header.

21. The method as recited in claim 14 wherein said SRAM array low voltage source is a sinking low drop out voltage regulator.

22. The method as recited in claim 14 wherein said sleep mode controller is a pMOSFET.

23. The method as recited in claim 14 wherein said sleep mode controller isolates said bit lines from a high power supply.

* * * * *